US009505608B2

(12) United States Patent
Arunasalam et al.

(10) Patent No.: US 9,505,608 B2
(45) Date of Patent: Nov. 29, 2016

(54) MICROVALVE HAVING A REDUCED SIZE AND IMPROVED ELECTRICAL PERFORMANCE

(71) Applicant: DunAn Microstaq, Inc., Austin, TX (US)

(72) Inventors: Parthiban Arunasalam, Austin, TX (US); Chen Yang, Austin, TX (US); E. Nelson Fuller, Manchester, MI (US); Joe A. Ojeda, Sr., Austin, TX (US); Gengxun Kara Gurley, Hutto, TX (US)

(73) Assignee: DunAn Microstaq, Inc., Austin, TX (US)

( * ) Notice: Subject to any disclaimer, the term of this patent is extended or adjusted under 35 U.S.C. 154(b) by 0 days.

(21) Appl. No.: 14/713,332

(22) Filed: May 15, 2015

(65) Prior Publication Data

US 2016/0053916 A1    Feb. 25, 2016

Related U.S. Application Data

(60) Provisional application No. 62/041,471, filed on Aug. 25, 2014.

(51) Int. Cl.
| F16K 11/065 | (2006.01) |
| B81B 7/00 | (2006.01) |
| F16K 99/00 | (2006.01) |

(52) U.S. Cl.
CPC ......... *B81B 7/0061* (2013.01); *F16K 99/0011* (2013.01); *F16K 99/0028* (2013.01); *F16K 99/0044* (2013.01); *B81B 2201/054* (2013.01); *B81B 2203/0307* (2013.01); *B81B 2203/0315* (2013.01); *F16K 2099/008* (2013.01)

(58) Field of Classification Search
CPC ................................. F16K 99/0042–99/0053
See application file for complete search history.

(56) References Cited

U.S. PATENT DOCUMENTS

| 6,540,203 | B1 | 4/2003 | Hunnicutt |
| 7,011,378 | B2 * | 3/2006 | Maluf .................. B81B 3/0024 |
| | | | 137/14 |
| 7,156,365 | B2 | 1/2007 | Fuller et al. |
| 8,011,388 | B2 | 9/2011 | Fuller et al. |
| 8,662,468 | B2 | 3/2014 | Hunnicutt |

* cited by examiner

*Primary Examiner* — John Fox
(74) *Attorney, Agent, or Firm* — MacMillan, Sobanski & Todd, LLC

(57) ABSTRACT

A microvalve includes a displaceable member having an elongated arm portion, a plurality of actuator ribs connected through a central spine to the elongated arm portion, and a hinge portion. Each of the actuator ribs has a first portion and a second portion, the first portions each having an end connected to the central spine, the second portions each having an end connected to the central spine. A channel is formed in the plate. A plurality of elongated openings is formed in the plate and define the actuator ribs, each elongated opening having longitudinally extending side edges. One of the elongated openings separates each rib in the second portion of ribs from an adjacent rib or the plate. The channel and a longitudinally extending side edge of one of the elongated openings separate the second portion of the actuator ribs from the plate and define an electrical isolation region.

17 Claims, 6 Drawing Sheets

MICROVALVE HAVING A REDUCED SIZE AND IMPROVED ELECTRICAL PERFORMANCE

CROSS REFERENCE TO RELATED APPLICATIONS

This application claims the benefit of U.S. Provisional Application No. 62/041,471 filed Aug. 25, 2014, the disclosure of which is incorporated herein by reference.

BACKGROUND OF THE INVENTION

This invention relates in general to microvalves for controlling the flow of fluid through a fluid circuit. In particular, this invention relates to an improved structure for such a microvalve that facilitates more efficient electrical performance, operates at a relatively high overvoltage condition, and has a reduced size and weight relative to a conventional microvalve such that the relative reduction in size and weight facilitates improved manufacturability.

Generally speaking, a micro-electro-mechanical system (MEMS) is a system that not only includes both electrical and mechanical components, but is additionally physically small, typically including features having sizes that are generally in the range of about ten micrometers or smaller. The term "micro-machining" is commonly understood to relate to the production of three-dimensional structures and moving parts of such micro-electro-mechanical system devices. In the past, micro-electro-mechanical systems used modified integrated circuit (e.g., computer chip) fabrication techniques (such as chemical etching) and materials (such as silicon semiconductor material), which were micro-machined to provide these very small electrical and mechanical components. More recently, however, other micro-machining techniques and materials have become available.

As used herein, the term "micro-machined device" means a device including features having sizes that are generally in the range of about ten micrometers or smaller and, thus, is at least partially formed by micro-machining. As also used herein, the term "microvalve" means a valve including features having sizes that are generally in the range of about ten micrometers or smaller and, thus, is also at least partially formed by micro-machining. Lastly, as used herein, the term "microvalve device" means a micro-machined device that includes a microvalve, but further includes additional components. It should be noted that if components other than a microvalve are included in the microvalve device, these other components may be either micro-machined components or standard-sized (i.e., larger) components. Similarly, a micro-machined device may include both micro-machined components and standard-sized components.

A variety of microvalve structures are known in the art for controlling the flow of fluid through a fluid circuit. One well known microvalve structure includes a displaceable member that is supported within a closed internal cavity provided in a valve body for pivoting or other movement between a closed position and an opened position. When disposed in the closed position, the displaceable member substantially blocks a first fluid port that is otherwise in fluid communication with a second fluid port, thereby preventing fluid from flowing between the first and second fluid ports. When disposed in the opened condition, the displaceable member does not substantially block the first fluid port from fluid communication with the second fluid port, thereby permitting fluid to flow between the first and second fluid ports.

End users of this conventional microvalve may require that the microvalve be able to sustain and remain operational at an input voltage increase, or overvoltage, of about 20 percent. Additionally, during assembly of a conventional microvalve, great care must be taken to accurately position the displaceable member within the closed internal cavity provided in the valve body to ensure proper function of the microvalve after assembly. It would be desirable, therefore, to provide a structure for microvalve that can operate at a relatively high overvoltage condition, and in which manufacturability is improved.

SUMMARY OF THE INVENTION

This invention relates in general to microvalves for controlling the flow of fluid through a fluid circuit. In particular, this invention relates to an improved structure for such a microvalve that includes a structure that facilitates more efficient electrical performance, operates at a relatively high overvoltage condition, and the components of which have a reduced size and weight relative to a conventional microvalve that facilitates improved manufacturability. In one embodiment, a plate is adapted for use in a microvalve and includes a displaceable member configured for movement between a closed position, wherein the displaceable member prevents fluid communication through the microvalve, and an opened position, wherein the displaceable member does not prevent fluid communication through the microvalve. The displaceable member includes an elongated arm portion, a plurality of actuator ribs connected through a central spine to the elongated arm portion, and a hinge portion. The actuator ribs have a first portion and a second portion, the first portion having a first end and a second end, the second end of the first portion connected to the central spine, the second portion having a first end and a second end, the second end of the second portion connected to the central spine. A channel is formed in the plate. A plurality of elongated openings is formed in the plate and define the actuator ribs, each elongated opening having longitudinally extending side edges. One of the elongated openings separates each rib in the second portion of ribs from an adjacent rib or the plate. The channel and a longitudinally extending side edge of one of the elongated openings separate the second portion of the actuator ribs from the plate and define an electrical isolation region.

Various advantages of the invention will become apparent to those skilled in the art from the following detailed description, when read in view of the accompanying drawings.

DETAILED DESCRIPTION OF THE INVENTION

The present invention will now be described with occasional reference to the specific embodiments of the invention. This invention may, however, be embodied in different forms and should not be construed as limited to the embodiments set forth herein. Rather, these embodiments are provided so that this disclosure will be thorough and complete, and will fully convey the scope of the invention to those skilled in the art.

As used in the description of the invention and the appended claims, the word "un-actuated" is defined as a steady-state condition of the microvalve device prior to application of electrical power to; i.e., prior to the actuation of the microvalve device actuator.

Referring now to the drawings, there is illustrated in FIGS. 1 through 5 a basic structure of a known, conventional microvalve 1. The illustrated microvalve 1 includes a cover plate 2, an intermediate plate 3, and a base plate 4. The cover plate 2 has an outer surface 5 and an inner surface 6. The cover plate 2 also has one or more openings (two of such openings 2a and 2b are shown in the illustrated embodiment) formed therethrough that, in a manner that is well known in the art, allow one or more electrically conductive wires (not shown) to pass therethrough. The intermediate plate 3 has a first surface 7 and a second surface 8. The base plate 4 has an inner surface 9 and an outer surface 10. The intermediate plate 3 of the illustrated conventional microvalve 1 has a length L1 of about 10.8 mm and a width W1 of about 4.8 mm. It will be understood that the cover plate 2 and the base plate 4 will typically also be manufactured at the same length and width dimensions as the intermediate plate 3.

Figure 1:
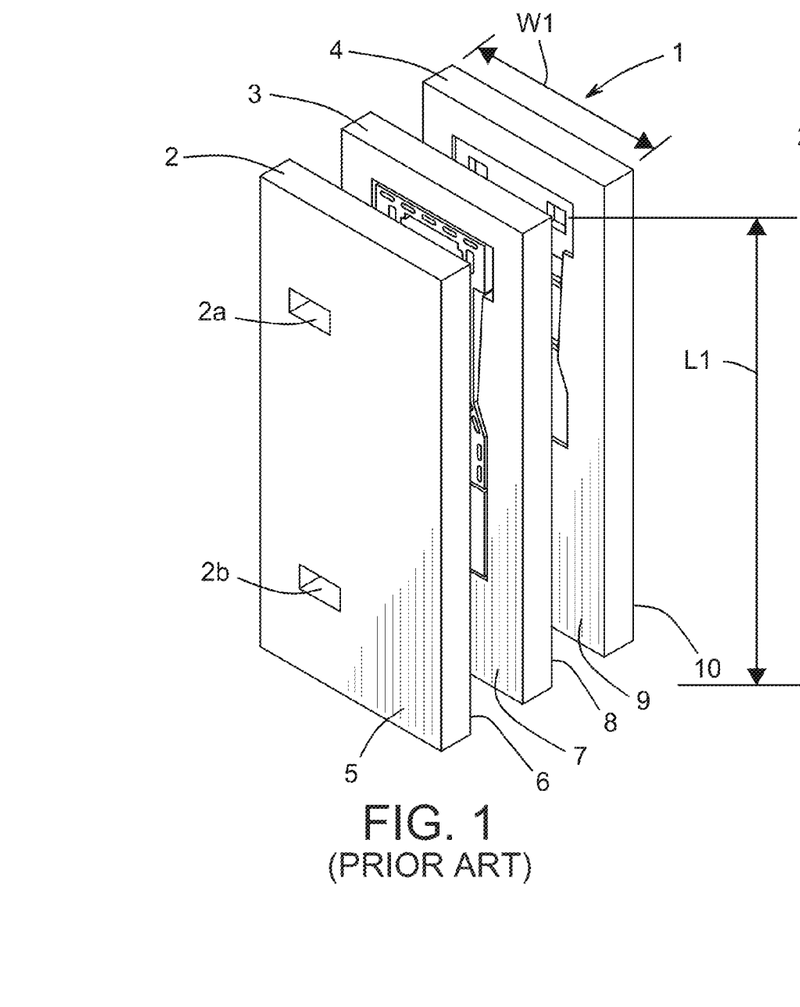
FIG. 1 is an exploded perspective view of a known microvalve having a cover plate, an intermediate plate, and a base plate.
Figure 5:
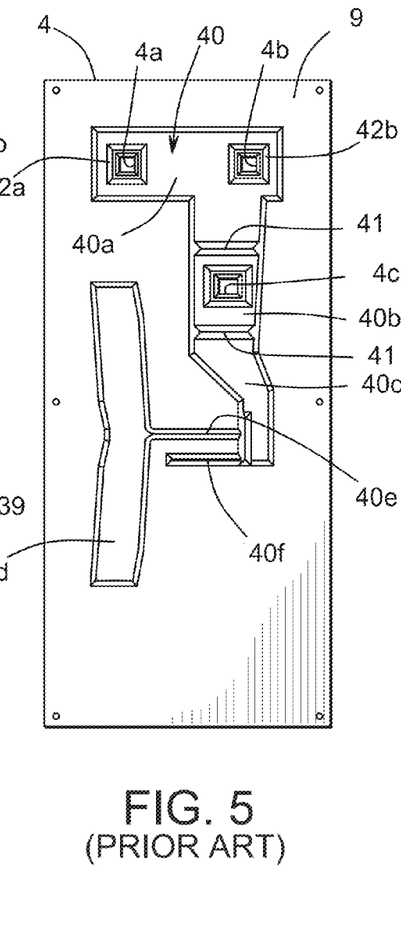
FIG. 5 is a plan view of an inner surface of the base plate illustrated in FIGS. 1 and 2.

The base plate 4 also has one or more openings (three of such openings 4a, 4b, and 4c are shown in the illustrated embodiment) formed therethrough that, in a manner that is well known in the art, allow fluid to flow in to and out of the microvalve 1.

Figure 2:
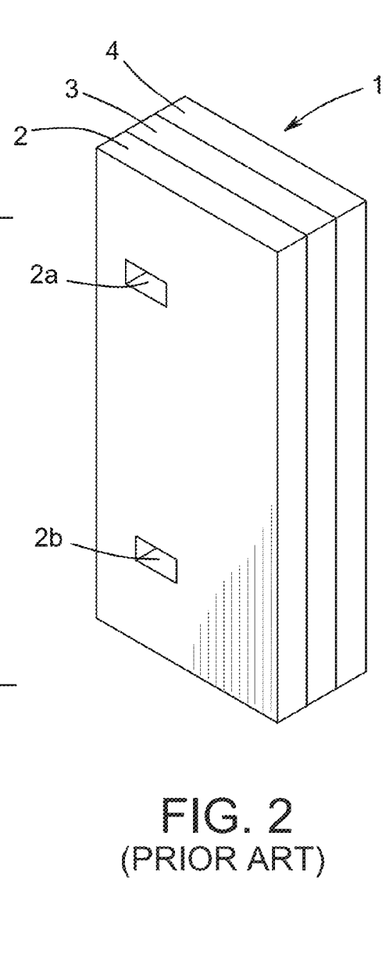
FIG. 2 is a perspective view of the known microvalve illustrated in FIG. 1 shown assembled.

When the microvalve 1 is assembled as shown in FIG. 2, the inner surface 6 of the cover plate 2 engages fixed portions of the first surface 7 of the intermediate plate 3, and the inner surface 9 of the base plate 4 engages fixed portions of the second surface 8 of the intermediate plate 3. The cover plate 2, the intermediate plate 3, and the base plate 4 may be retained in this orientation in any desired manner. For example, portions of the cover plate 2 and/or the base plate 4 may be bonded to the intermediate plate 3, such as by fusion bonding, chemical bonding, or physically bonding (such as, for example, mechanical fasteners and/or adhesives). The cover plate 2, the intermediate plate 3, and the base plate 4 may be composed of any desired material or combination of materials. For example, the cover plate 2, the intermediate plate 3, and the base plate 4 may be composed of silicon and/or similar materials. In the embodiment illustrated and discussed, the cover plate 2 and the base plate 4 are electrically non-conductive, while the intermediate plate 3 is a doped silicon semiconductor material that heats and expands when electrical current is passed therethrough.

Figures 3, 4:
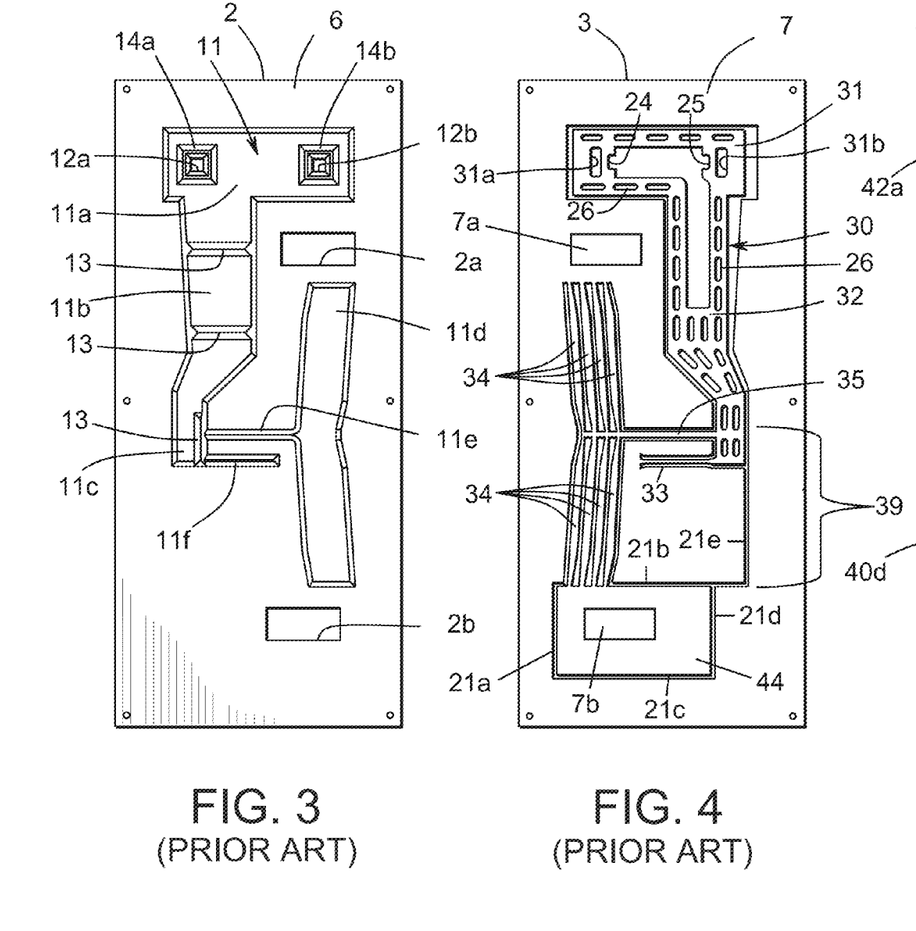
FIG. 3 is a plan view of an inner surface of the cover plate illustrated in FIGS. 1 and 2.
FIG. 4 is a plan view of the intermediate plate illustrated in FIGS. 1 and 2.

The structure of the inner surface 6 of the cover plate 2 for the microvalve 1 is illustrated in detail in FIG. 3. As shown therein, the cover plate 2 includes an actuator cavity, indicated generally at 11, that is provided on the inner surface 6 thereof. The illustrated actuator cavity 11 includes an upper actuator arm cavity portion 11a, a central actuator arm cavity portion 11b, a lower actuator arm cavity portion 11c, an actuator rib cavity portion 11d, an actuator spine cavity portion 11e, and an actuator hinge cavity portion 11f. The upper actuator arm cavity portion 11a has a pair of recessed areas 12a and 12b provided therein. The illustrated actuator cavity 11 also has one or more pressure equalization depressions 13 provided therein.

The cover plate 2 has a first sealing structure 14a that extends from the bottom surface of the actuator cavity 11 and completely about the perimeter of the first recessed area 12a. Similarly, the cover plate 2 also has a second sealing structure 14b that extends from the bottom surface of the actuator cavity 11 and completely about the perimeter of the second recessed area 12b. In the illustrated embodiment, each of the sealing structures 14a and 14b is a wall that is generally trapezoidal in cross-sectional shape and includes four linearly-extending wall segments that extend adjacent to the four sides of the recessed areas 12a and 12b. However, the sealing structures 14a and 14b may be formed having any desired cross-sectional shape or combination of shapes, and may further extend in any desired manner (linearly or otherwise) about the recessed areas 12a and 12b. For example, the sealing structures 14a and 14b may be formed substantially as shown in FIG. 3, but may have rounded corners between adjacent linearly-extending wall segments, have one or more non-linearly-extending wall segments, or be entirely non-linear in shape. The purpose for the sealing structures 14a and 14b will be explained below.

The structure of the first surface 7 of the intermediate plate 3 for the microvalve 1 is illustrated in detail in FIG. 4. As shown therein, the conventional intermediate plate 3 includes a movable valve member or displaceable member, indicated generally at 30, that includes a sealing portion 31 having a pair of openings 31a and 31b formed therethrough. The sealing portion 31 is connected through an elongated arm portion 32 to a hinge portion 33 that is formed integrally with the conventional intermediate plate 3. The intermediate plate 3 also includes an actuator including a plurality of actuator ribs 34 that is connected through a central spine 35 to the elongated arm portion 32 at a location that is intermediate of the sealing portion 31 and the hinge portion 33. The hinge portion 33 is formed in a pivot anchor region 39 defined between the central spine 35 and a channel 21b, described below, and further between the actuator ribs 34 and a channel 21e, also described below.

The sealing portion 31 also includes notches 24 and 25, each defining a metering edge, for controlling the flow of fluid through the microvalve 1, and a plurality of pressure equalization openings 26 for reducing or preventing pressure imbalances so as to minimize or prevent "out of plane" movement of the sealing portion 31 of the displaceable member 30 during actuation and un-actuation thereof.

As shown in FIG. 4, a first portion of the plurality of actuator ribs 34 (the upper ribs 34 when viewing FIG. 4) are flexibly joined at first ends thereof to a first non-moving part of the intermediate plate 3. Second ends of the first portion of the plurality of actuator ribs 34 are connected to the central spine 35. The first non-moving part of the intermediate plate 3 is electrically connected to a first bond pad 7a that is provided on the intermediate plate 3. Similarly, a second portion of the plurality of actuator ribs 34 (the lower ribs 34 when viewing FIG. 4) are flexibly joined at first ends thereof to a second non-moving part of the intermediate plate 3. Second ends of the second portion of the plurality of actuator ribs 34 are also connected to the central spine 35. The second non-moving part of the intermediate plate 3 is electrically connected to a second bond pad 7b that is provided on the intermediate plate 3.

The intermediate plate 3 may also include channels 21a, 21b, 21c, 21d, and 21e formed through the intermediate plate 3. The channels 21a, 21b, 21c, and 21d are formed through the intermediate plate 3 to define a generally rectangular isolation region 44 at first ends of the second portion of the actuator ribs 34, physically separating the isolation region 44 from the rest of the intermediate plate 3 except for the plurality of actuator ribs 34. As discussed above, the cover plate 2 and the base plate 4 are electrically non-conductive. The second bond pad 7b formed on the isolation region 44 is thus electrically isolated from the first bond pad 7a, other than through the plurality of actuator ribs 34.

The channels 21a, 21b, 21c, 21d, and 21e may also function as fluid flow passages and are configured to allow fluid flow within the intermediate plate 3 during operation of the microvalve 1. This flowing fluid may cool the portions of the intermediate plate 3 immediately adjacent the channels 21a, 21b, 21c, 21d, and 21e. The channels 21a, 21b, 21c, 21d, and 21e may also allow air to be purged from the first ends of the second portion of the actuator ribs 34 and out of the microvalve 1 through one of the openings 4a, 4b, and 4c.

In a manner that is well known in the art, electrical current may be passed from the first bond pad 7a through the plurality of actuator ribs 34 to the second bond pad 7b. Such electrical current causes heating and thermal expansion of the plurality of actuator ribs 34, which causes axial movement of the central spine 35. As described above, the central spine 35 is connected to the elongated arm portion 32. Consequently, axial movement of the central spine 35 causes the elongated arm portion 32 (and, therefore, the sealing portion 31) of the displaceable member 30 to pivot about the hinge portion 33 or otherwise move relative to the rest of the intermediate plate 3 between an un-actuated position, as shown in FIG. 4, and an actuated position wherein the pivoting movement of the displaceable member 30 causes the sealing portion 31 to move relative to the rest of the intermediate plate 3 (to the right when viewing FIG. 4). This movement of the elongated arm portion 32 occurs within a plane defined by the rest of the intermediate plate 3, between the cover plate 2 and the base plate 4. Thus, the illustrated displaceable member 30 functions as a conventional micro-electro-mechanical system.

For example, in the microvalve 1, the opening 4a may be configured as a normally open fluid port, the opening 4b may be configured as a normally closed fluid port, and the opening 4c may be configured as a common fluid port. When the displaceable member 30 is in the un-actuated position, the opening 4a is in an open position and the opening 4b is in a closed position. In the open position, the notch 24 is positioned such that it overlaps a portion of the opening 4a, thereby allowing fluid flow between the opening 4c and the opening 4a. When the opening 4b is in the closed position, the notch 25 is positioned away from the opening 4b, thereby substantially preventing fluid flow through the opening 4b, and therefore between the opening 4c and the opening 4b.

The structure of the inner surface 9 of the base plate 4 is illustrated in detail in FIG. 5. As shown therein, the base plate 4 includes an actuator cavity, indicated generally at 40, that is provided on the inner surface 9 thereof. The illustrated actuator cavity 40 includes an upper actuator arm cavity portion 40a, a central actuator arm cavity portion 40b, a lower actuator arm cavity portion 40c, an actuator rib cavity portion 40d, an actuator spine cavity portion 40e, and a hinge cavity portion 40f. The illustrated actuator cavity 40 also has one or more pressure equalization depressions 41 provided therein.

The base plate 4 has a first sealing structure 42a that extends from the bottom surface of the actuator cavity 40 and completely about the perimeter of the first opening 4a. Similarly, the base plate 4 also has a second sealing structure 42b that extends from the bottom surface of the actuator cavity 40 and completely about the perimeter of the second opening 4b. The sealing structures 42a and 42b are described in detail in U.S. patent application Ser. No. 14/313,138, filed Jun. 24, 2014, the disclosure of which is incorporated herein by reference in its entirety.

Figure 6:
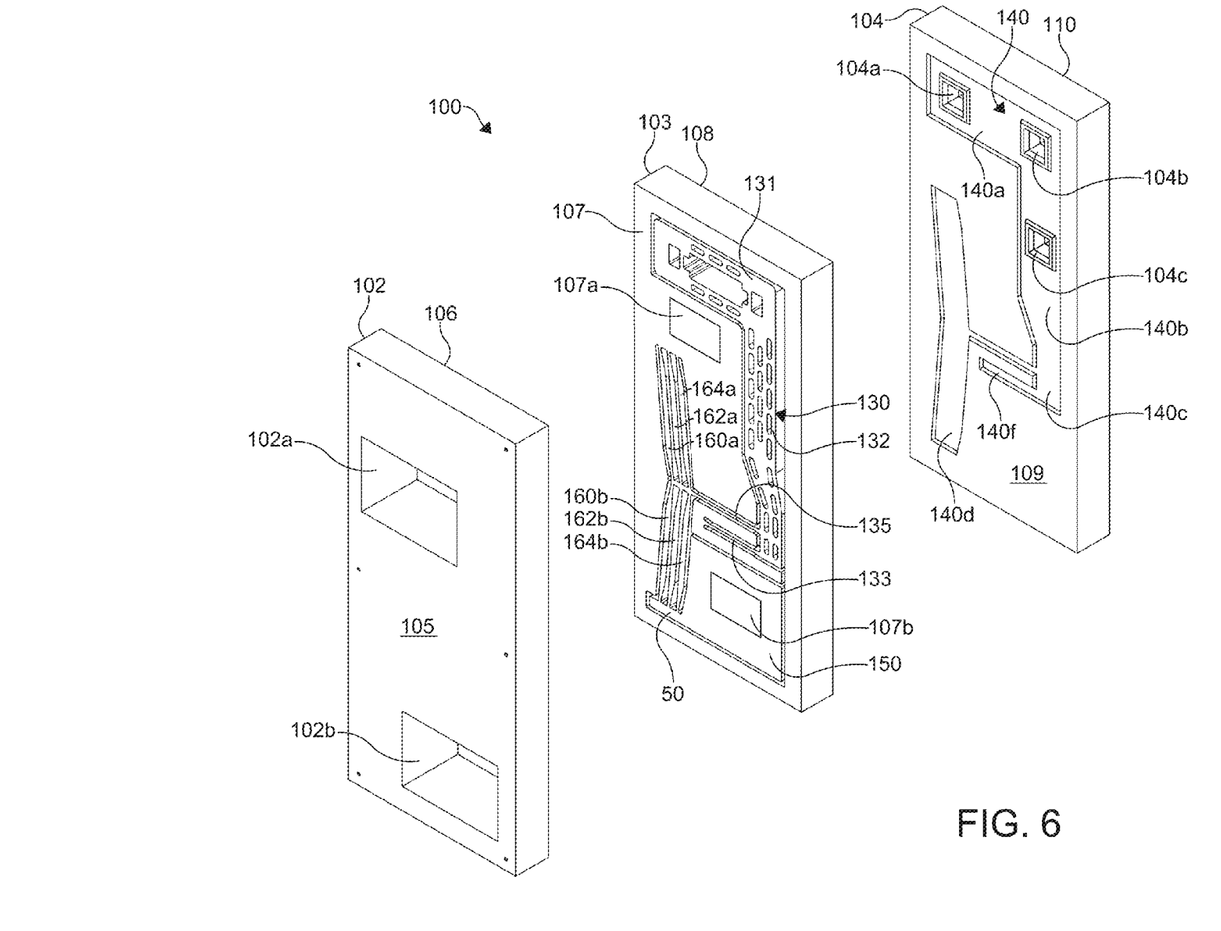
FIG. 6 is an exploded perspective view of a microvalve according to the invention showing a cover plate, an intermediate plate, and a base plate.
Figure 7:
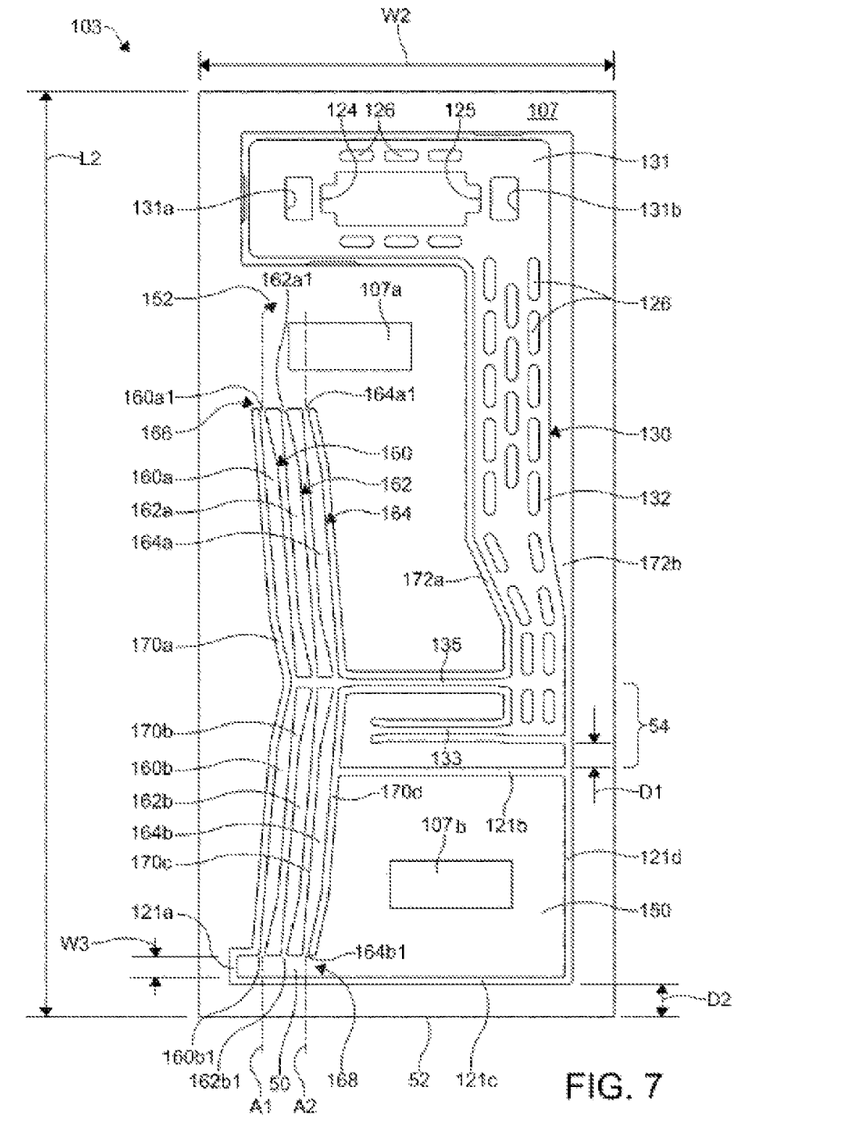
FIG. 7 is a plan view of the intermediate plate illustrated in FIG. 6.
Figure 8:
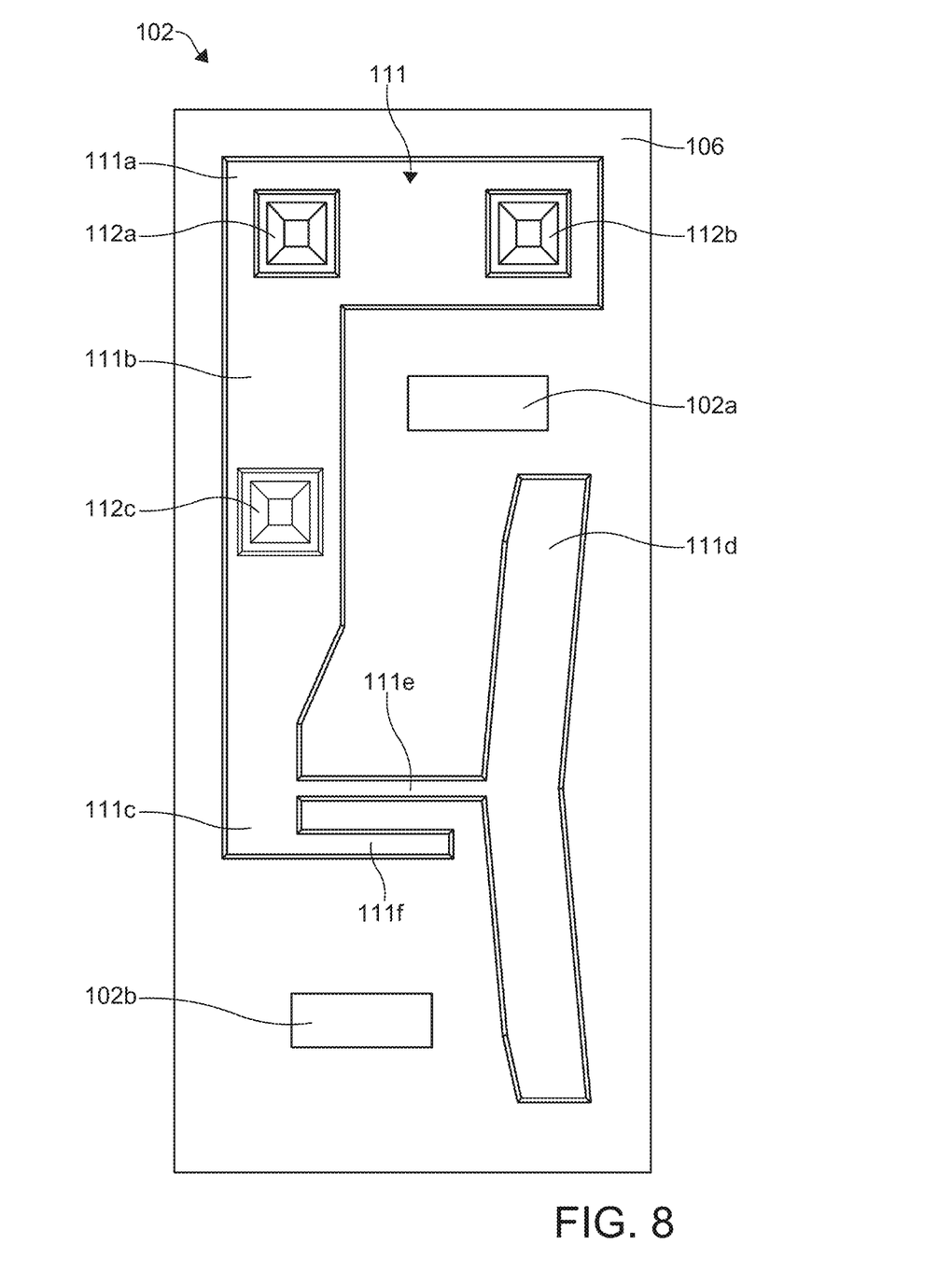
FIG. 8 is a plan view of the inner surface of the base plate illustrated in FIG. 6.

FIGS. 6 through 8 illustrate portions of an improved microvalve 100 in accordance with this invention. The basic structure of the microvalve 100 of this invention is similar to that shown in FIGS. 1 and 2 and, therefore, includes a cover plate 102, an intermediate plate 103, and a base plate 104. The cover plate 102 has an outer surface 105 and an inner surface 106. The cover plate 102 also has one or more openings (two of such openings 102a and 102b are shown in the illustrated embodiment) formed therethrough that, in a manner that is well known in the art, allow one or more electrically conductive wires (not shown) to pass therethrough. The intermediate plate 103 has a first surface 107 and a second surface 108. The base plate 104 has an inner surface 109 and an outer surface 110. The base plate 104 also has one or more openings (three of such openings 104a, 104b, and 104c are shown in the illustrated embodiment) formed therethrough that, in a manner that is well known in the art, allow fluid to flow in to and out of the microvalve 100.

When the microvalve 100 is assembled, the inner surface 106 of the cover plate 102 engages fixed portions of the first surface 107 of the intermediate plate 103, and the inner surface 109 of the base plate 104 engages fixed portions of the second surface 108 of the intermediate plate 103. The cover plate 102, the intermediate plate 103, and the base plate 104 can be retained in this orientation in any desired manner. For example, portions of the cover plate 102 and/or the base plate 104 may be bonded to the intermediate plate 103, such as by fusion bonding, chemical bonding, or physically bonding (such as, for example, mechanical fasteners and/or adhesives). The cover plate 102, the intermediate plate 103, and the base plate 104 may be composed of any desired material or combination of materials. For example, the cover plate 102, the intermediate plate 103, and the base plate 104 may be composed of silicon and/or similar materials. In the preferred embodiment of the present invention, the cover plate 102 and the base plate 104 are not electrically conductive, while the intermediate plate 103 is a doped silicon semiconductor material that heats and expands when electrical current is passed therethrough.

The structure of the inner surface 106 of the cover plate 102 of this invention is illustrated in detail in FIG. 8. As shown therein, the cover plate 102 of this invention includes an actuator cavity, indicated generally at 111, that is provided on the inner surface 106 thereof. The illustrated actuator cavity 111 includes an upper actuator arm cavity portion 111a, a central actuator arm cavity portion 111b, a lower actuator arm cavity portion 111c, an actuator rib cavity portion 111d, an actuator spine cavity portion 111e, and a hinge cavity portion 111f. The upper actuator arm cavity portion 111a has a pair of recessed areas 112a and 112b provided therein. A third recessed area 112c is formed in the central actuator arm cavity portion 111b.

As shown in FIG. 7, the intermediate plate 103 of this invention includes a displaceable member, indicated generally at 130, that includes a sealing portion 131 having a pair of pressure equalization openings 131a and 131b formed therethrough. The sealing portion 131 also includes notches 124 and 125, each defining a metering edge, for controlling the flow of fluid through the microvalve 100 and a plurality of pressure equalization openings 126. The pressure equalization openings 126, 131a, and 131b are configured to reduce or prevent pressure imbalances of the sealing portion 131 that would otherwise tend to cause movement of the arm portion 132 out of the plane of normal arcuate motion during actuation and un-actuation thereof.

The sealing portion 131 is connected through an elongated arm portion 132 to a hinge portion 133 that is formed integrally with the intermediate plate 103 of this invention. The elongated arm portion 132 is separated from the intermediate plate 103 by elongated openings 172a and 172b, as best shown in FIG. 7. The hinge portion 133 is formed in a pivot anchor region 54 defined between a central spine 135 and a channel 121b, described below, and between an elongated opening 170d and a channel 121d, both described below. In the illustrated embodiment, the channel 121b is spaced a distance D1 from the hinge portion 133. The distance D1 is preferably relatively small, such as within the range of about 20 µm to about 250 µm. It will be understood that the distance D1 needs only to be wide enough such that the material of the intermediate plate 103 between the hinge portion 133 and the channel 121b can be securely bonded to the adjacent cover plate 102 and base plate 104.

The displaceable member 130 also includes a plurality of actuator rib pairs 160, 162, and 164. Each rib pair 160, 162, and 164 is separated from an adjacent rib pair or from the intermediate plate 103 by an elongated opening 170a, 170b, 170c, and 170d. Although only three actuator rib pairs are shown, any number of actuator rib pairs may be provided. The actuator rib pairs 160, 162, and 164 are connected through the central spine 135 to the elongated arm portion 132 at a location that is preferably intermediate of the sealing portion 131 and the hinge portion 133.

Each actuator rib pair 160, 162, and 164 includes a first rib 160a, 162a, and 164a, respectively, and a second rib 160b, 162b, and 164b, respectively. First ends 160a1, 162a1, and 164a1 of the first ribs 160a, 162a, and 164a (the upper ribs shown in FIG. 7) are flexibly joined to a first non-moving part of the intermediate plate 103 of this invention. Second ends of the first ribs 160a, 162a, and 164a are connected to the central spine 135. First ends 160b1, 162b1, and 164b1 of the second ribs 160b, 162b, and 164b (the lower ribs shown in FIG. 7) are flexibly joined to a second non-moving part of the intermediate plate 103 of this invention. Second ends of the second ribs 160b, 162b, and 164b are also connected to the central spine 135.

The first non-moving part of the intermediate plate 103 is electrically connected to a first bond pad 107a provided on the intermediate plate 103. This first non-moving part of the intermediate plate 103 further defines a non-electrically isolated region 152. The second non-moving part of the intermediate plate 103 is electrically connected to a second bond pad 107b provided on the intermediate plate 103.

The plurality of actuator rib pairs 160, 162, and 164 include at least a first outermost actuator rib pair, such as the rib pair 160, and a second outermost actuator rib pair, such as the rib pair 164, spaced apart from the first outermost rib pair 160. Rib axes A1 and A2 are defined as extending through and beyond the first ends of each rib in each of the outermost rib pairs 160 and 164 of the plurality of actuator rib pairs. In the illustrated embodiment, the first rib axis A1 is defined as extending through and beyond the first ends 160a1 and 160b1 of the actuator ribs 160a and 160b, respectively (the left-most rib pair when viewing FIG. 7). Similarly, the second rib axis A2 is defined as extending through and beyond the first ends 164a1 and 164b1 of the actuator ribs 164a and 164b, respectively (the right-most rib pair when viewing FIG. 7). A first rib attachment region 166 is defined between the first and second axes A1 and A2 at the first ends 160a1, 162a1, and 164a1 of the first ribs 160a, 162a, and 164a, and a second rib attachment region 168 is defined between the first and second axes A1 and A2 at the first ends 160b1, 162b1, and 164b1 of the second ribs 160b, 162b, and 164b.

The intermediate plate 103 may also include channels 121a, 121b, 121c, and 121d formed through the intermediate plate 103. The channels 121a, 121b, 121c, and 121d are formed through the intermediate plate 103 and connect the elongated opening 170a at the first ends 160b1, 162b1, and 164b1 of the second ribs 160b, 162b, and 164b to the elongated opening 170d at a position intermediate the central spine 135 and the first ends 160b1, 162b1, and 164b1 of the second ribs 160b, 162b, and 164b, and also to the elongated opening 172 between the elongated arm portion 132 and the intermediate plate 103.

The channels 121a, 121b, 121c, and 121d, and a longitudinally extending side edge one of the elongated opening 170d also define a boundary of an isolation region 150 that physically separates the isolation region 150 from the rest of the intermediate plate 103, except through the actuator rib pairs 160, 162, and 164. As discussed above, the cover plate 102 and the base plate 104 are electrically non-conductive. The second bond pad 107b formed in the isolation region 150 is thus electrically isolated from the first bond pad 107a, other than through the actuator rib pairs 160, 162, and 164. Significantly, the portion of the isolation region 150 located outside of the second rib attachment region 168 is larger than the second rib attachment region 168.

Like the channels 21a, 21b, 21c, 21d, and 21e formed through the intermediate plate 3, the channels 121a, 121b, 121c, and 121d may also function as fluid flow passages and are configured to allow fluid flow within the intermediate plate 103 during operation of the microvalve 100. This fluid may cool the portions of the intermediate plate 103 immediately adjacent the channels 121a, 121b, 121c, and 121d. The channels 121a, 121b, 121c, and 121d may also allow air to be purged from near the first ends 160b1, 162b1, and 164b1 of the second ribs 160b, 162b, and 164b and out of the microvalve 100 through one of the openings 104a, 104b, and 104c.

In the illustrated embodiment, the channel 121c is spaced a distance D2 from an edge 52 of the intermediate plate 103. The distance D2 is preferably relatively small, such as within the range of about 50 µm to about 250 µm. It will be understood that the distance D2 needs only to be wide enough such that the material of the intermediate plate 103 between the channel 121c and the edge 52 can be securely bonded to the adjacent cover plate 102 and base plate 104.

In a manner that is well known in the art, electrical current may be passed from the first bond pad 107a through the plurality of actuator rib pairs 160, 162, and 164 to the second bond pad 107b within the isolation region 150. Such electrical current causes thermal expansion of the plurality of actuator rib pairs 160, 162, and 164, which causes axial movement of the central spine 135. As described above, the central spine 135 is connected to the elongated arm portion 132. Consequently, axial movement of the central spine 135 causes the elongated arm portion 132 (and, therefore, the sealing portion 131) of the displaceable member 130 to pivot about the hinge portion 133 or otherwise move relative to the rest of the intermediate plate 103 (such movement occurring within a plane defined by the rest of the intermediate plate 103). Thus, the illustrated displaceable member 130 functions as a micro-electro-mechanical system flow control element, i.e., the moveable part of a microvalve that directly controls flow through the microvalve. Furthermore, the plurality of actuator rib pairs 160, 162, and 164, cooperate with the central spine 135 to form a thermal actuator for selectively moving the displaceable member 130 to pivot about the hinge portion 133

The isolation region 150 includes a relatively narrow portion or strip 50 defined between the first ends 160b1, 162b1, and 164b1 of the second ribs 160b, 162b, and the passage 121c, extending parallel to the edge 52 of the intermediate plate 103. In the illustrated embodiment, the narrow strip 50 has a width W3 of about 0.2 mm. The narrow strip 50 may also have other desired widths, such as between 0.175 mm and 0.5 mm. It will be understood that the narrow strip 50 is formed from the same semiconductor material used to form the rest of the intermediate plate 103, for example silicon.

Advantageously, fluid flowing through the channels 121a, 121b, 121c, and 121d, and particularly through the channel 121c, is only spaced apart from the first ends 160b1, 162b1, and 164b1 by the width W3. Thus, the amount of cooling provided to the second ribs 160b, 162b, and 164b at the first ends 160b1, 162b1, and 164b1 thereof by the fluid is greater relative to an amount of cooling provided to the actuator ribs 34 in the isolation region 44 of the prior art microvalve 1.

The structure of the inner surface 109 of the base plate 104 of this invention is illustrated in detail in FIG. 6. As shown therein, the base plate 104 of this invention includes an actuator cavity, indicated generally at 140, that is provided on the inner surface 109 thereof. The illustrated actuator cavity 140 includes an upper actuator arm cavity portion 140a, a central actuator arm cavity portion 140b, a lower actuator arm cavity portion 140c, an actuator rib cavity portion 140d, an actuator spine cavity portion 140e, and a hinge cavity portion 140f.

Referring again to FIG. 7, the illustrated bond pad 107a is located adjacent (above when viewing FIG. 7) the first ends 160a1, 162a1, and 164a1 of the first ribs 160a, 162a, and 164a. The bond pad 107b is located adjacent the second ribs 160b, 162b, and 164b near the first ends thereof (to the right and above the first ends 160b1, 162b1, and 164b1 of the second ribs 160b, 162b, and 164b when viewing FIG. 7) and also above (when viewing FIG. 7) the narrow strip 50.

As described above, during actuation of the microvalve 100, the plurality of actuator rib pairs 160, 162, and 164 are heated by passing an electrical current therethrough. The actuator rib pairs 160, 162, and 164 then undergo thermal expansion and elongate, which urges the central spine 135 and the attached arm portion 132 away from the actuator rib pairs 160, 162, and 164 (to the right when viewing FIG. 7). The arm portion 132 then bends or flexes at the hinge portion 133 to accommodate movement of the central spine 135, thereby causing the sealing portion 131 and its notches 124 and 125 to move in the plane of normal motion along an arcuate path (to the right when viewing FIG. 7) to a stressed position, which closes the opening 104a and opens the opening 104b.

When the electrical current is removed from the plurality of actuator rib pairs 160, 162, and 164, the actuator rib pairs 160, 162, and 164 cool and contract, urging the central spine 135 back toward the actuator rib pairs 160, 162, and 164 (to the left when viewing FIG. 7). The arm portion 132 and sealing portion 131 then return to an un-actuated position, as shown in FIG. 7, wherein the opening 104a is again open, and the opening 104b is again closed.

As described above and shown in FIG. 7, the second bond pad 107b is adjacent the second ribs 160b, 162b, and 164b (to the right when viewing FIG. 7) and above (when viewing FIG. 7) the narrow strip 50. Although the second bond pad 107b is spaced a greater distance away from the first ends 160b1, 162b1, and 164b1 of the second ribs 160b, 162b, and 164b than the second bond pad 7b is spaced from the first ends of the second portion of the plurality of actuator ribs 34 in the conventional microvalve 1, electrical performance is surprisingly improved relative to the conventional microvalve 1.

A typical nominal input voltage for the microvalve 1 illustrated in FIGS. 1 through 5 is 12V. During prototype testing, at 12V, the microvalve 1 was found to have a maximum current density of 5125 A/m$^2$. End users of the microvalve 1 typically require that the microvalve 1 be able to sustain and remain operational (i.e., continue to operate without the actuator rib pairs 160, 162, and 164 melting) when an input voltage increase, or overvoltage, of at least about 20 percent occurs. The illustrated microvalve 1, for example, will remain operational with an input voltage increase of up to at least about 14.4V.

Figure 9A:
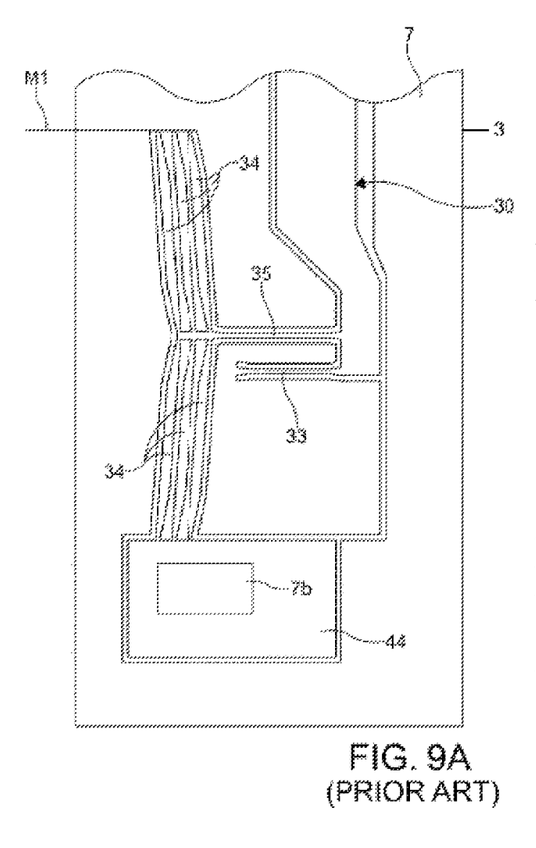
FIG. 9A is a partial plan view of the known intermediate plate illustrated in FIG. 4 showing the location of maximum current density.
Figure 9B:
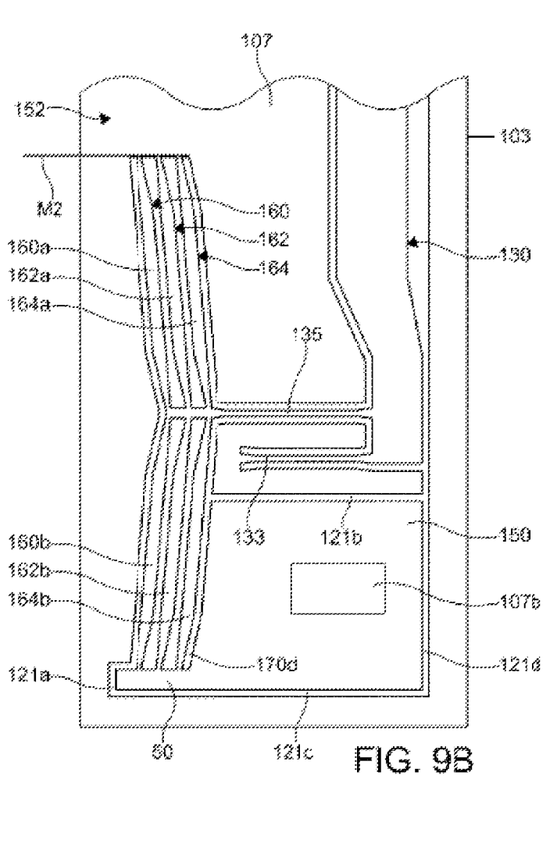
FIG. 9B is a partial plan view of the intermediate plate illustrated in FIGS. 6 and 7 showing the location of maximum current density.

The location at which the maximum current density occurs is in a substantially unchanged in the improved microvalve 100 compared to the microvalve 1. FIGS. 9A and 9B illustrate the location of maximum current density for the microvalve 1 (shown by the line M1), and for the microvalve 100 (shown by the line M2). For both the intermediate plate 3 and the intermediate plate 103, the location of maximum current density is the same. In the intermediate plate 3, the location of maximum current density is at the first end of the first portion of the actuator ribs 34. In the intermediate plate 103, the location of maximum current density is at the first ends 160a1, 162a1, and 164a1 of the first ribs 160a, 162a, and 164a.

Advantageously, the improved microvalve 100 has a maximum current density of 4510 A/m$^2$ at an input voltage of 12V. This represents improvement of about 12 percent (a reduction in maximum current density from 5125 A/m$^2$ to 4510 A/m$^2$) for the microvalve 100 relative to the microvalve 1. To reach the same maximum current density as the microvalve 1, the input voltage for the microvalve 100 must be raised by about 14 percent, i.e., from 12V to 13.7V. Thus, at a 14 percent overvoltage condition the microvalve 100 will have a maximum current density of 5130 A/m$^2$. Thus, when the microvalve 100 is experiencing a 14 percent overvoltage, the maximum current density in the microvalve 100 will only rise to a value that is very close to the current density reached in the microvalve 1 at the nominal input voltage of only 12V. This 14 percent overvoltage needed to increase current density to the value previously seen in the microvalve 1 at nominal 12 volt input represents an increased margin to valve failure; i.e., a further increase in the overvoltage level which must be experienced by the microvalve 100 (compared to the microvalve 1) before the actuator rib pairs 160, 162, and 164 melt. During prototype testing, it was found that the microvalve 100 will remain operational at an input voltage of up to about 20V (an overvoltage of about 66 percent), an input voltage value significantly greater than the overvoltage increase of about 20 percent, or 14.4V in the microvalve 1, required by the typical end user.

The intermediate plate 103 has a significantly reduced size and surface area relative to conventional intermediate plates in conventional microvalves, such as the intermediate plate 3 in the microvalve 1 illustrated in FIGS. 1 through 5. For example, the conventional microvalve 1 can be fabricated using the intermediate plate 3, which may have a length L1 of about 10.8 mm and a width W1 of about 4.8 mm. In contrast, the microvalve 100 of this invention can be fabricated using the intermediate plate 103, which may have a length L2 of about 8.6 mm and a width W2 of about 3.9 mm. This represents a reduction in length of about 20 percent and a surface area reduction of about 35 percent in the intermediate plate 103 relative to the intermediate plate 3. It will be understood that the cover plate 102 and the base plate 104 will typically be manufactured with the same dimensions as the intermediate plate 103.

During manufacturing, a plurality of each of the component plates of a microvalve 100, such as the component plates 102, 103, and 104, are typically formed from a silicon disk or wafer. Once the component plates 102, 103, and 104 are formed in the silicon wafer, the silicon wafers are stacked and bonded into what is commonly referred to as a silicon wafer stack. Such a silicon wafer stack may include two or more silicon wafers aligned and bonded together. The microvalve 100 is then cut or otherwise removed from the wafer stack by any desired conventional method. Advantageously, the surface area reduction of the component plates 102, 103, and 104 of about 35 percent allows for the increase in the number of microvalves 100 per wafer stack, and also allows for a significant reduction of manufacturing cost per microvalve 100.

To achieve the reduced length L2, there is less intermediate plate 103 material between the first ends 160b1, 162b1, and 164b1 of the second ribs 160b, 162b, and 164b and the edge 52 of the intermediate plate 103. This represents a surface area reduction of about 35 percent in the intermediate plate 103 relative to the conventional intermediate plate 3. To facilitate this reduction in surface area, and as described above, the second bond pad 107b is located adjacent the second ribs 160b, 162b, and 164b near the first ends thereof (to the right and above the first ends 160b1, 162b1, and 164b1 of the second ribs 160b, 162b, and 164b when viewing FIG. 7) and also above (when viewing FIG. 7) the narrow strip 50.

As best shown in FIG. 7, an area of the pivot anchor region 54 is within about 50 percent to about 80 percent smaller than an area of the electrical isolation region 150. Additionally, the pivot anchor region 54, defined between central spine 135 and the channel 121b, is significantly smaller than the pivot anchor region 39 of the intermediate plate 3 in the conventional microvalve 1. In the embodiment illustrated, the reduced size of the pivot anchor region 54 results in a mass reduction of about 80 percent for the pivot anchor region 54 relative to the pivot anchor region 39. The reduced mass of the pivot anchor region 54 means that the hinge portion 133 is required to support less mass during assembly than in the known microvalve 1, greatly reducing the amount of movement or play of the pivot anchor region 54 during assembly, and thereby significantly reducing the comparative potential of the mass of the pivot anchor region 54 dangling off the hinge portion 133 to gain sufficient momentum during handling to exert a force on the hinge portion 133 sufficient to overstress and break the hinge portion 133.

The reduced mass of the pivot anchor region 54 also enables the metering edge of the notch 125 to be more accurately aligned with the cover plate 102 and the base plate 104, especially with the opening 104b, during assembly. Since the lesser mass of the pivot anchor region 54 moving generates comparatively less force to bend the hinge portion 133, the pivot anchor region 54 will move around relatively less during handling, with a more damped motion (compared to the more massive pivot anchor region 39), easing the task of positioning the pivot anchor region 54 in the desired relationship with the adjacent fixed cover plate 102 and base plate 104. Thus, reducing the mass of the pivot anchor region 54 allows processing time; i.e., the time required to align the intermediate plate 103 with the cover plate 102 and the base plate 104 during assembly to be reduced.

Accurately positioning the pivot anchor region 54 is important because, when assembling the conventional microvalve 1, any misalignment of the intermediate plate 3 near the hinge portion 33 and relative to the base plate 4 and the cover plate 2, will be magnified by a factor of 10 at the notches 24 and 25 of the sealing portion 31. Correcting such a misalignment is time consuming. Further if uncorrected, such a misalignment of the notches 24 and 25 relative to the openings 4a and 4b, respectively, may degrade the operation of the assembled microvalve 1.

This improved alignment of the intermediate plate 103 relative to the cover plate 102 and the base plate 104 greatly improves accuracy of assembly and bonding yield, reduces scrap rate, and therefore improves overall manufacturability. Surprisingly and advantageously, it has been shown that the significantly smaller and less massive pivot anchor region 54 of the microvalve 100 (compared to the pivot anchor region 39 of the microvalve 1) allows for a reduction in throughput or cycle time when aligning and bonding the silicon wafers together during manufacture of the microvalve 100, and results in a five-fold improvement in throughput or cycle time relative to the manufacture of the known microvalve 1.

Additionally, it has been shown that the microvalve 100 formed with the intermediate plate 103 experiences no reduction in deflection of the arm portion 132 relative to the arm portion 32.

As described above, the bond pad 107b is adjacent the second ribs 160b, 162b, and 164b and above (when viewing FIG. 6) the narrow strip 50. Advantageously, placement of the bond pad 107b adjacent the second ribs 160b, 162b, and 164b and above the narrow strip 50 allows the overall length L2 of the intermediate plate 103 to be reduced about 20 percent relative to the overall length L1 of the intermediate plate 3. While a reduction of size of the microvalve 100 is an advantage, the improved microvalve 100 of the present invention offers other unexpected and non-obvious advantages, including improved cycle time through easier handling, reduced scrap rate through reduced breakage and more accurate positioning of components, and improved electrical margins, as discussed above.

The principle and mode of operation of the invention have been described in its preferred embodiments. However, it should be noted that the invention described herein may be practiced otherwise than as specifically illustrated and described without departing from its scope.

What is claimed is:

1. A microvalve comprising:
   a first plate;
   a second plate;
   a first opening formed through one of the first and second plates;
   a second opening formed through one of the first and second plates; and
   an intermediate plate disposed between the first plate and the second plate, the intermediate plate including:
   (1) a displaceable member movable between an opened position, wherein fluid communication is permitted between the first and second openings, and a closed position, wherein fluid communication is prevented between the first and second openings;
   (2) an actuator rib including a first end connected to the intermediate plate, a second end connected to the intermediate plate, and a spine connected to the displaceable member such that movement of the actuator rib causes movement of the displaceable member between the opened and closed positions;
   (3) a channel formed through the intermediate plate that extends from the second end of the actuator rib to adjacent a portion of the actuator rib located between the spine and the second end of the actuator rib to define an electrical isolation region;
   (4) a first bond pad located adjacent to the first end of the actuator rib; and
   (5) a second bond pad located within the electrical isolation region.

2. The microvalve defined in claim 1 wherein the displaceable member is connected through a hinge portion to the intermediate plate for pivoting movement between the opened and closed positions.

3. The microvalve defined in claim 1 further including a plurality of actuator ribs, wherein each actuator rib includes a first end connected to the intermediate plate, a second end connected to the intermediate plate, and a spine connected to the displaceable member.

4. The microvalve defined in claim 1 wherein the spine extends from a central portion of the actuator rib to the displaceable member.

5. The microvalve defined in claim 1 wherein a strip of the intermediate plate having a width of from about 0.175 mm to about 0.5 mm is defined between the second end of the actuator rib and a portion of the channel.

6. The microvalve defined in claim 1 wherein a strip of the intermediate plate having a width of about 0.2 mm is defined between the second end of the actuator rib and a portion of the channel.

7. The microvalve defined in claim 1 wherein the second bond pad is located within the electrical isolation region adjacent to a portion of the actuator rib located between the channel and the second end.

8. The microvalve defined in claim 1 wherein an elongated opening having a longitudinally extending side edge is provided in the intermediate plate and defines the actuator rib, and wherein the second bond pad is located adjacent to the longitudinally extending side edge of the elongated opening.

9. The microvalve defined in claim 1 wherein an elongated opening having a longitudinally extending side edge is provided in the intermediate plate and defines the actuator rib, and wherein the second bond pad is located closer to the longitudinally extending side edge of the elongated opening than the second end of the actuator rib.

10. A microvalve comprising:
    a first plate;
    a second plate;
    a first opening formed through one of the first and second plates;
    a second opening formed through one of the first and second plates; and
    an intermediate plate disposed between the first plate and the second plate, the intermediate plate including:
    (1) a displaceable member movable between an opened position, wherein fluid communication is permitted between the first and second openings, and a closed position, wherein fluid communication is prevented between the first and second openings;
    (2) a plurality of actuator ribs, each actuator rib including a first end connected to the intermediate plate, a second end connected to the intermediate plate, and a spine connected to the displaceable member such that movement of the plurality of actuator ribs causes movement of the displaceable member between the opened and closed positions;
    (3) a channel formed through the intermediate plate that extends from the second ends of the plurality of actuator ribs to adjacent a portion of the plurality of actuator ribs located between the spine and the second ends of the plurality of actuator ribs to define an electrical isolation region;
    (4) a first bond pad located adjacent to the first ends of the plurality of actuator ribs; and
    (5) a second bond pad located within the electrical isolation region.

11. The microvalve defined in claim 10 wherein the displaceable member is connected through a hinge portion to the intermediate plate for pivoting movement between the opened and closed positions.

12. The microvalve defined in claim 10 wherein the spine extends from a central portion of each of the plurality of actuator ribs to the displaceable member.

13. The microvalve defined in claim 10 wherein a strip of the intermediate plate having a width of from about 0.175 mm to about 0.5 mm is defined between the second ends of each of the plurality of actuator ribs and a portion of the channel.

14. The microvalve defined in claim 10 wherein a strip of the intermediate plate having a width of about 0.2 mm is defined between the second ends of each of the plurality of actuator ribs and a portion of the channel.

15. The microvalve defined in claim 10 wherein the second bond pad is located within the electrical isolation region adjacent to a portion of each of the plurality of actuator ribs located between the channel and the second ends.

16. The microvalve defined in claim 10 wherein a plurality of elongated openings having longitudinally extending side edges is provided in the intermediate plate and defines each of the plurality of actuator ribs, and wherein the second bond pad is located adjacent to the longitudinally extending side edges of the elongated openings.

17. The microvalve defined in claim 10 wherein a plurality of elongated openings having longitudinally extending side edges is provided in the intermediate plate and defines each of the plurality of actuator ribs, and wherein the second bond pad is located closer to the longitudinally extending side edges of the elongated openings than the second ends of each of the plurality of actuator ribs.

* * * * *